United States Patent

Sader et al.

[11] 4,033,695
[45] July 5, 1977

[54] PROCESS AND APPARATUS FOR COPYING ON PRINTING PLATES

[75] Inventors: George Sader, Bechtheim; Dieter Osswald, Wiesbaden-Sonnenberg, both of Germany

[73] Assignee: Hoechst Aktiengesellschaft, Germany

[22] Filed: May 27, 1975

[21] Appl. No.: 581,159

[30] Foreign Application Priority Data

May 29, 1974 Germany .......................... 2426216

[52] U.S. Cl. ................................. 355/87; 248/363; 355/91; 355/132
[51] Int. Cl.² ........................................ G03B 27/20
[58] Field of Search ................. 355/87, 91, 93, 94, 355/76, 132; 248/362, 363

[56] References Cited

UNITED STATES PATENTS

| | | | |
|---|---|---|---|
| 3,259,046 | 7/1966 | Nishimura | 355/91 X |
| 3,512,487 | 5/1970 | Krantz et al. | 355/91 X |
| 3,556,656 | 1/1971 | Evensen | 355/94 |

Primary Examiner—R. L. Moses
Attorney, Agent, or Firm—James E. Bryan

[57] ABSTRACT

A process and apparatus for exposing light-sensitive printing plates through an original to be copied, which includes forming a cassette-type, vacuum frame assembly by superimposing the printing plate and the original upon one another and disposing them in a cavity formed between an elastic blanket and a light-permeable plate, and evacuating the assembly, to improve contact between the printing plate and the original, at a position removed from a light means, thereafter temporarily placing the assembly in a position to be exposed to the light means and finally removing the assembly from the exposure position. A vacuum frame assembly is provided having a connect-disconnect means for temporary attachment both to the evacuation means removed from the light source and, if desired, to an evacuation means at the exposure position. Transport systems are also provided, including conveyor belts or transport chains for sequentially transporting a plurality of assemblies to and from the exposure position and from a feed magazine to a discharge magazine via the exposure position.

22 Claims, 8 Drawing Figures

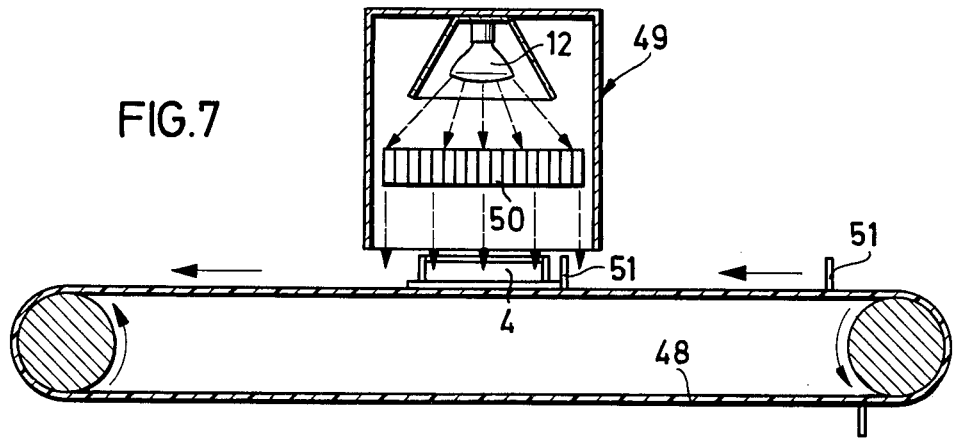
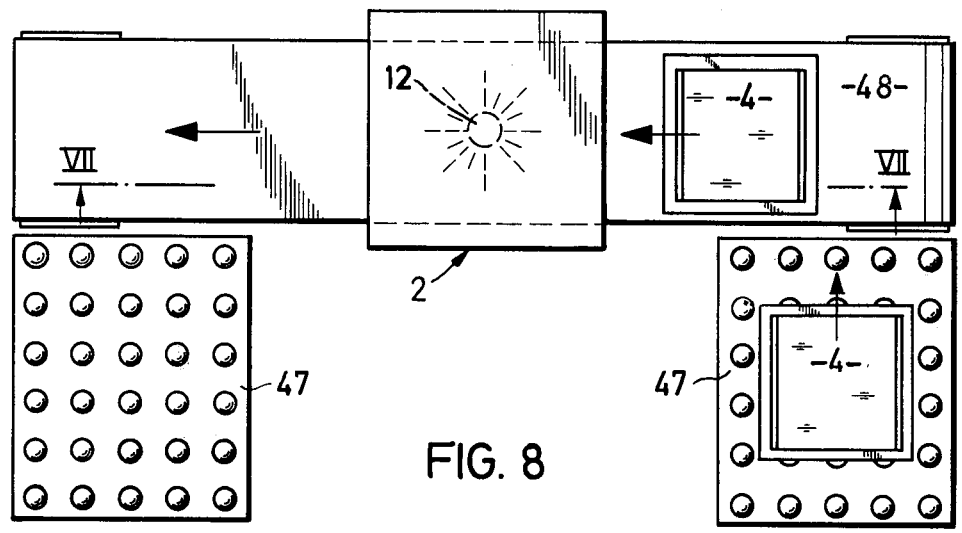

PROCESS AND APPARATUS FOR COPYING ON PRINTING PLATES

The present invention relates to a process for copying on printing plates, wherein a light-sensitive printing plate, to be exposed to light, and the original, to be copied and through which the plate is exposed, are in intimate contact with one another and apparatus for performing such process.

Prior art apparatus for copying on printing plates through an original, in contact with the printing plate, generally include a vacuum copying frame, in which the printing plate to be exposed to light and the original are pressed together between a glass plate, adjacent the original, and a rubber blanket, adjacent the printing plate, by drawing a vacuum thereon, and a light source, for exposing the printing plate to light through the glass plate and the original.

The basic prior art vacuum frame and light source apparatus may have various articulated forms and positions relative to one another but, in all cases, they form an integrated or functional unit. For example, the vacuum frame and ligh source may be in a single housing or in separate housings. However, in the latter case, the housings are in fixed spatial relationship to one another to form a functional unitary arrangement. The light source may be stationary or movable, to facilitate loading of the vacuum frame or adjustment of the light to frame distance, and it may be adapted to strike the printing plate from a horizontal or a vertical direction. The vacuum frame may be a single frame for copying on one printing plate, or a double frame, for simultaneously copying on two printing plates. In the latter instance, the vacuum frame will be pivoted to facilitate loading each side of the frame with a separate printing plate to be copied on. In any event, whether the vacuum frame is a frame for copying on one printing plate or a pivotable frame for copying on two printing plates, and whether the vacuum frame is in the same housing as the light source or a separate housing, the vacuum frame itself is always mounted in a fixed location and is located in a fixed position relative to the light source mounting.

In the operation of all of the variations of the prior art apparatus referred to above, the vacuum frame is opened, the copying assembly, comprising the printing plate and the original, is inserted, the vacuum frame is closed, a vacuum is drawn on the assembly and the printing plate is exposed to the light source through the glass plate of the vacuum frame and the original. Following exposure, the vacuum frame is again opened, the copying assembly is removed and the exposed printing plate is then ready for development and finishing.

A major problem with such prior art processes and apparatuses is the fact that efficient and effective operation cannot be achieved. Specifically, the exposure operation must be interrupted each time the vacuum frame is loaded and unloaded. The duration of such interruption obviously depends upon the construction of the apparatus, particularly the ease of loading and unloading, and the skill and dexterity of the operator in loading and unloading the machine. In addition, it is obvious that only a single operator can perform the manual labor of loading and unloading the vacuum frame of the apparatus and, hence, a production line-type of operation, wherein more than one operator performs the required manual tasks while the exposure apparatus is operated continuously or semi-continuously, cannot be carried out. It is also known that the timing of the operations of getting a sensitized plate to the exposure stage, the timing of the actual exposure and the timing of getting the exposed plate to and through development and finishing are critical. For example, with all sensitized coatings, the exposure time must be carefully controlled and, with some sensitized coatings, inordinate delays or widely varying times for getting the sensitized plate to exposure and getting the exposed plate developed and finished cannot be tolerated, since "dark reaction" and "continuing reaction", respectively, can occur.

It is, therefore, an object of the present invention to provide an improved process and apparatus for copying on printing plates which overcome the above-mentioned and other problems of the prior art processes and apparatuses.

Another object of the present invention is to provide an improved process and apparatus for copying on printing plates in which copying is carried out in the shortest possible time and which makes it possible to effectively and efficiently utilize a single exposure apparatus for the exposure of a plurality of plates in a short time.

A further object of the present invention is to provide an improved process for copying on printing plates in which the printing plate and original are assembled in a vacuum frame and evacuated and the evacuated assembly is thereafter subjected to light exposure.

A further object of the present invention is to provide an improved apparatus for copying on printing plates in which the printing plate and original are assembled in a vacuum frame and the assembly is evacuated prior to entry into the apparatus, after entry into the apparatus but before the assembly is subjected to light exposure, when the assembly is in position for light exposure or any combination thereof.

Yet another object of the present invention is to provide an improved apparatus for copying on printing plates wherein the printing plate and original are assembled in a vacuum frame and the entire assembly is insertable into and removable from the apparatus for light exposure of the plate.

Another and further object of the present invention is to provide an improved apparatus for copying on printing plates wherein the printing plate and original are assembled in a vacuum frame, the entire assembly is insertable into and removable from the apparatus for light exposure of the plate and the assembly is detachably connectable to a source of vacuum at the location at which exposure occurs, at a location displaced from the location at which exposure occurs or both.

Still another object of the present invention is to provide an improved process and apparatus for copying on printing plates wherein a plurality of printing plates and corresponding originals are assembled in a plurality of vacuum frames, the assemblies are insertable into and removable from the apparatus for light exposure of the plate and such assemblies are sequentially passed through and exposed to light in the exposure apparatus in a continuous or semi-continuous manner.

Another object of the present invention is to provide an improved process and apparatus for copying on printing plates having an improved cassette-type vacuum frame which is a unitary structure separate and apart from the apparatus for light exposure of the printing plate.

A further object of the present invention is to provide an improved cassette-type vacuum frame, for holding a printing plate to be copied on and an original to be copied, which includes means for detachable connection to a source of vacuum.

Another and further object of the present invention is to provide a source of vacuum which includes means for detachable connection to a cassette-type vacuum frame, for holding a printing plate to be copied on and an original to be copied, and which can be mounted on apparatus for light exposure of the printing plate or separate therefrom.

In accordance with the present invention, an improved vacuum frame for copying on a printing plate is provided, which is in the form of a cassette, is adapted to have assembled therein the printing plate to be copied on and the original to be copied and is insertable into and removable from apparatus for light exposure of the plate. The cassette may be inserted into and removed from the apparatus for light exposure of the plate by hand, by mechanically transporting the same through the light exposure apparatus or by mechanically transporting the same through the light exposure apparatus in sequence with a plurality of like cassettes, either continuously or intermittently. The cassette may also be provided with means for quickly attaching and detaching a source of vacuum thereto. An improved vacuum source means, having a matching quick-connect means for releasable coupling to the cassette, is also provided which may be separate and apart from the light exposure apparatus or may be a part of the light exposure apparatus, either at the location at which exposure occurs or, when the cassette is mechanically transported therethrough at a location prior to the location at which light exposure occurs. In the latter instance, the vacuum source means may also be detachably connected to the cassette, travel part way through the apparatus for light exposure with the cassette and then be detached from the cassette. The apparatus for light exposure may also be provided with a receiving magazine for receiving a plurality of cassettes, means for continuously or intermittently and sequentially transporting the cassettes through a light exposure station and a discharge magazine for collecting exposed cassettes, or simply with a means for continuously or intermittently and sequentially transporting the cassettes through the light exposure station.

The operation of the preferred embodiment of the copying apparatus involves the following working steps:

1. Loading and evacuating a cassette-type, vacuum frame with the copying assembly, i.e. with the printing plate and the original, outside the copying apparatus;
2. inserting the loaded cassette into a charging magazine of the copying apparatus;
3. Automatically connecting the cassette to a vacuum device;
4. Transporting th cassette and connected vacuum device to a light exposure station;
5. Exposing the cassette to light;
6. Automatically separating the vacuum device from the cassette; and
7. Transporting the cassette to a discharge magazine of the copying apparatus.

In contradistinction to the known copying apparatus, the working steps (positioning of the copying assembly in a vacuum frame, evacuation and removal of the copying assembly from the copying frame) are separated from the exposure procedure. The vacuum device, travelling with the cassette, serves the primary function of maintaining the vacuum produced in the vacuum frame cassette outside the exposure device.

The following advantages of the preferred apparatus are obtained over the hitherto known copying apparatus for printing plates:

1. The printing plates and the originals are placed in the vacuum frame cassettes outside the exposure device. A hitherto unknown acceleration of the preparatory work becomes possible thereby. Furthermore, sources of error can be eliminated with more accuracy, e.g. the originals can be positioned in exact register on the printing plates, air-bubble free pressing of the original onto the printing plate during evacuation of the copying frame cassette can be attained and removal of dust and dirt particles from the printing plate, the original, and the glass plate of the vacuum frame cassette is possible;

2. Automatic fixed-cycle transport from the charge magazine into the exposure device and from there into the discharge magazine ensures optimum use of the exposure device. Within a certain working time, the number of the exposure cycles is markedly higher than in the case of the hitherto known copying apparatuses. The cycle times depend on the individual exposure time to be selected and on the construction of the cassette transport system. Whereas, in the case of conventional copying apparatus, an average of 10 copying cycles per hour can be expected, an average of 20 copying cycles per hour can be achieved with the copying apparatus of the invention; and 3. The exposure device, with the charge and discharge stations, can be substantially better coordinated with the working cycles of printing plate processing plants than is possible with conventional copying apparatus, since the copying frame cassettes can be introduced and removed during the exposure cycles.

The above and other objects and advantages of the present invention will be apparent from the following description when read in conjunction with the drawings, wherein.

Figure 5:
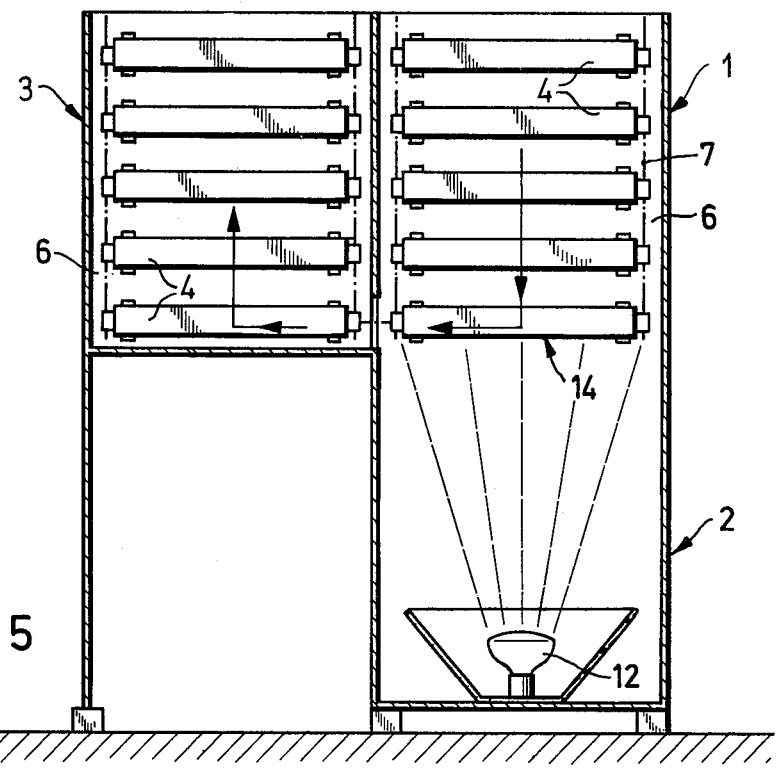
Figure 6:
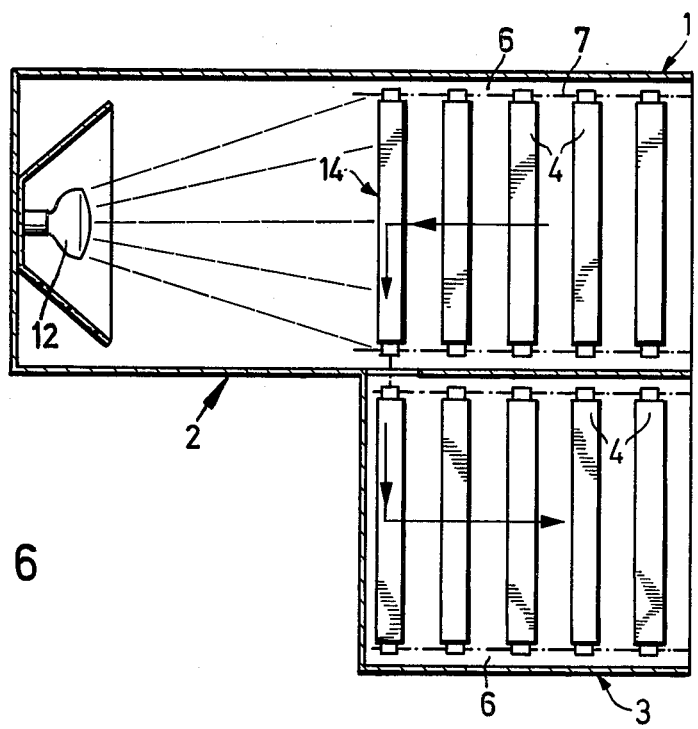

FIGS. 5 and 6 each diagrammatically show apparatus with modified cassette guidance systems;

FIG. 7 is a section along the line VII — VII of FIG. 8 and diagrammatically shows an apparatus for continuous cassette transport through the exposure station; and FIG. 8 is a diagrammatic plan view of the apparatus shown in FIG. 7.

Figure 1:
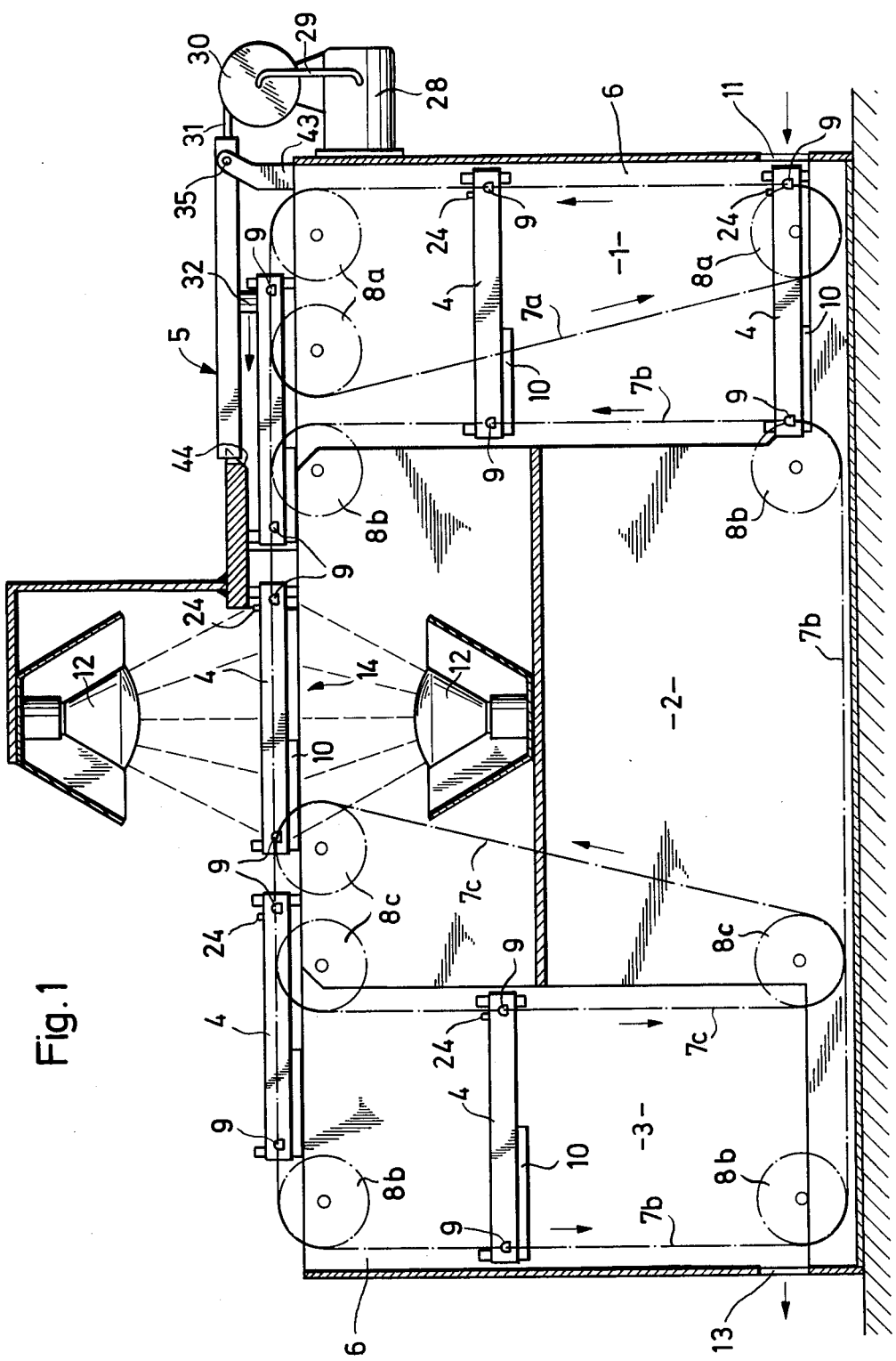
FIG. 1 shows a section through an apparatus according to the invention.

According to the exemplary embodiment of FIG. 1, the new copying apparatus substantially consists of a feed section 1, an exposure section 2 and a discharge section 3.

The printing plate to be exposed to light, together with its original provided for copying, is placed in a cassette-type, vacuum copying frame and is pressed onto the original under the action of a vacuum by connecting the vacuum frame to a vacuum source, as has been known for a long time for vacuum copying frames. When the vacuum copying frames are introduced into the apparatus, the vacuum produced therein is maintained only to the extent necessary to compensate for vacuum lost due to leakage. Either one or, as in the case of FIG. 1, a combination of two of the vacuum copying frames form one cassette 4. The cassettes 4 pass through the apparatus from the feed station 1 via the exposure section 2 through the discharge section 3. Preferably, the cassettes 4 are again connected to a supplementary evacuation device before the printing plates are exposed to light in the exposure section 2. Advantageously, the cassettes are connected to the supplementary evacuation device before they are introduced into the exposure section and travel, with the cassette to the exposure section. The apparatus shown in FIG. 1, therefore, is provided, in the upper part of the feed section 1, with an evacuation device 5. The vacuum device 5 is provided with two movable vacuum connections to which the two vacuum copying frames of each cassette 4 remain connected when they leave the feed section 1, are on the way to the exposure section 2, and remain thereon during exposure to light. The evacuation device 5 will be further illustrated below.

The feed section 1, as well as the discharge section 3, each substantially consist of conveyor shafts 6. They are equipped with transport devices for the cassettes, of which only guide rolls and endless conveyor chains passed around them are diagrammatically shown in FIG. 1. The cassettes 4 are conveyed through the inlet conveyor shaft 6 (on the right hand side in FIG. 1), from the bottom to the top, then through the exposure section 2, from there to the outlet conveyor shaft 6 (on the left hand side in FIG. 1), and therethrough, from the top to the bottom, by means of an endless front and an endless rear conveyor chain 7b which is passed around the front and rear guide rolls 8b, respectively. In the inlet conveyor shaft, cassette transport is assisted by the endless conveyor chain 7a passed around the three front and the three guide rolls 8a, respectively, and in the outlet conveyor shaft by the endless conveyor chain 7c placed around the three front and the three rear guide rolls 8c, respectively. The cassettes 4 are provided with engaging pieces 9, engaging the endless conveyor chains in any known manner, e.g. by pins attached thereto. The cassettes may be provided with guide elements 10 which serve to assist the cassettes 4, particularly when they are introduced into the feed section 1 through the inlet aperture 11, when they are conveyed from the feed section 1 to the exposure station and into the exposure position 14 between the two light sources 12, when they are conveyed from there to the discharge section 3 and when they are removed from the discharge section 3 through the outlet aperture 13.

It can be seen that the transport devices 7 – 8 can automatically be driven according to a selectable fixed-cycle program so that each copying frame remains in the exposure position for such a time as is necessary for the exposure of the printing plates and for the measures required in connection therewith, such as switching on and switching off of the light sources 12. Such time cycles may be computer controlled or controlled by electric-eye switches or pressure switches combined with appropriate time delays or timers. Spectral emission of the light sources 12, in the exposure section, is, of course, adjusted for the light-sensitive layer of the printing plates. Particularly suitable light sources are high-pressure mercury lamps or doped, high-pressure mercury lamps (metal halogen bulbs). The exposure times achievable with such light sources are from about 1 to 3 minutes, with the use of the light-sensitive printing plates normally used in offset printing and letterpress printing, and ensure exposure cycles, including transporting time, from about 1.5 to 3.5 minutes.

Figure 2:
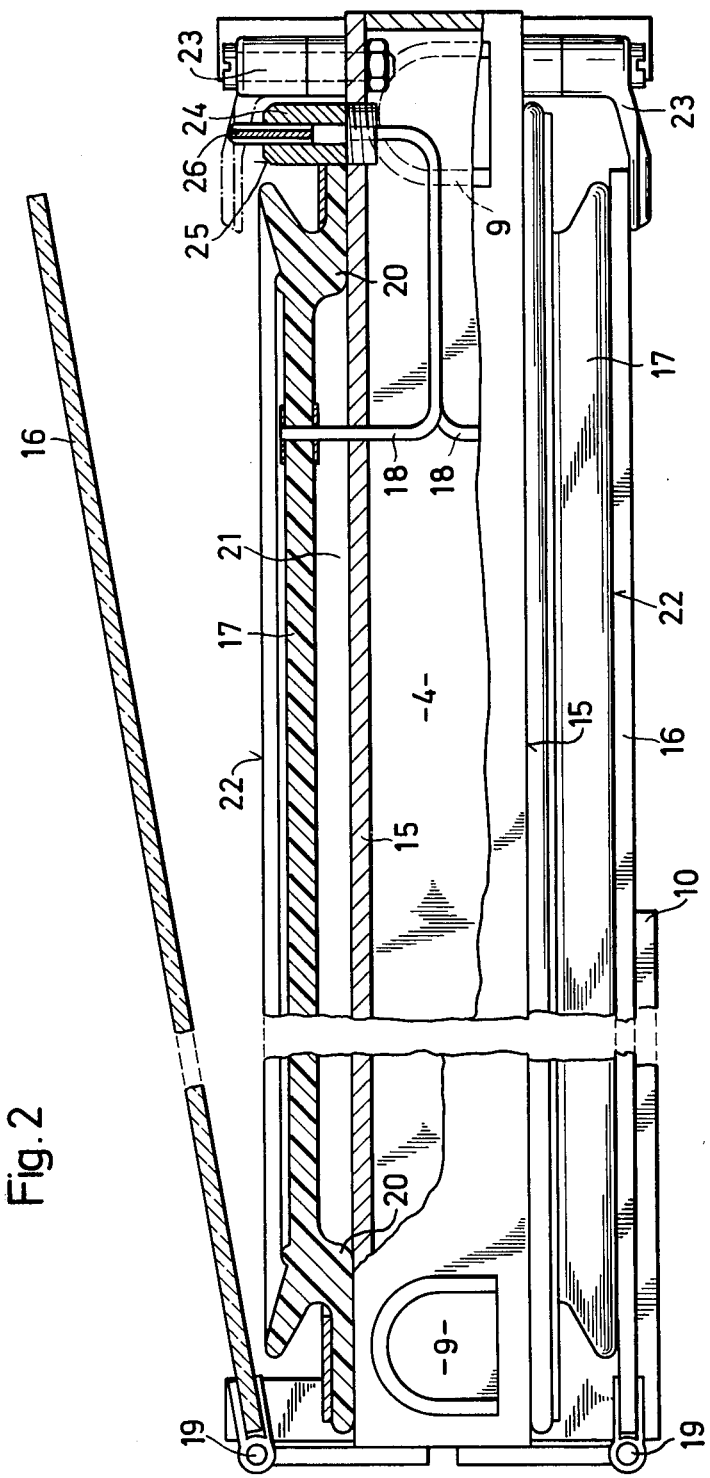
FIG. 2 is a front elevation, partially in section, and shows the essential parts of the double cassette, shown in FIG. 1, on an enlarged scale.

FIG. 2 shows an opened, double copying frame cassette, as was generally illustrated in FIG. 1. It has two base plates 15, two glass plates 16, two rubber blankets 17, and two evacuation conduits 18, of which one passes to the upper and the other one to the lower rubber blanket 17. The two base plates form a box-shaped body to which the glass plates 16 are each hinged by means of hinges 19. The rubber blankets 17 lie against the base plates 15 by means of a bead frame 20. Between them and the base plates 15, there are thus formed hollow spaces 21, by means of which it is possible for the rubber blankets to closely join the assembly of printing plate and original, lying upon one another, when the assembly, between the rubber blanket 17 and the glass plate 16, is pressed together and onto the glass plate by the action of the vacuum. The conduits 18, serving for the connection to the evacuation device, are each passed through a base plate 15 and the adjoining rubber blanket 17. The side of the rubber blanket 17 facing the glass plate 16 is provided with a projecting sealing edge 22 by means of which it is possible that, when the glass plate is laid upon the rubber blanket, a separate space is formed to which the evacuation conduit 18 leads. For holding the glass plate 16 and the rubber blanket 17 mechanically together, there is provided turnbolts 23. Double cassettes, as described thus far, are substantially known. The double cassette shown in FIG. 2, however, is new compared to the known double cassettes particularly in that its evacuation conduits 18 lead to connecting pieces 24, which are part of quick-connect or connect-disconnect plug coupling. The connecting pieces 24 have a sealing surface 25 and an opening pin 26 projecting therefrom, which serves for opening a ball valve in an evacuation device, as will be referred to hereinafter.

Figure 3:
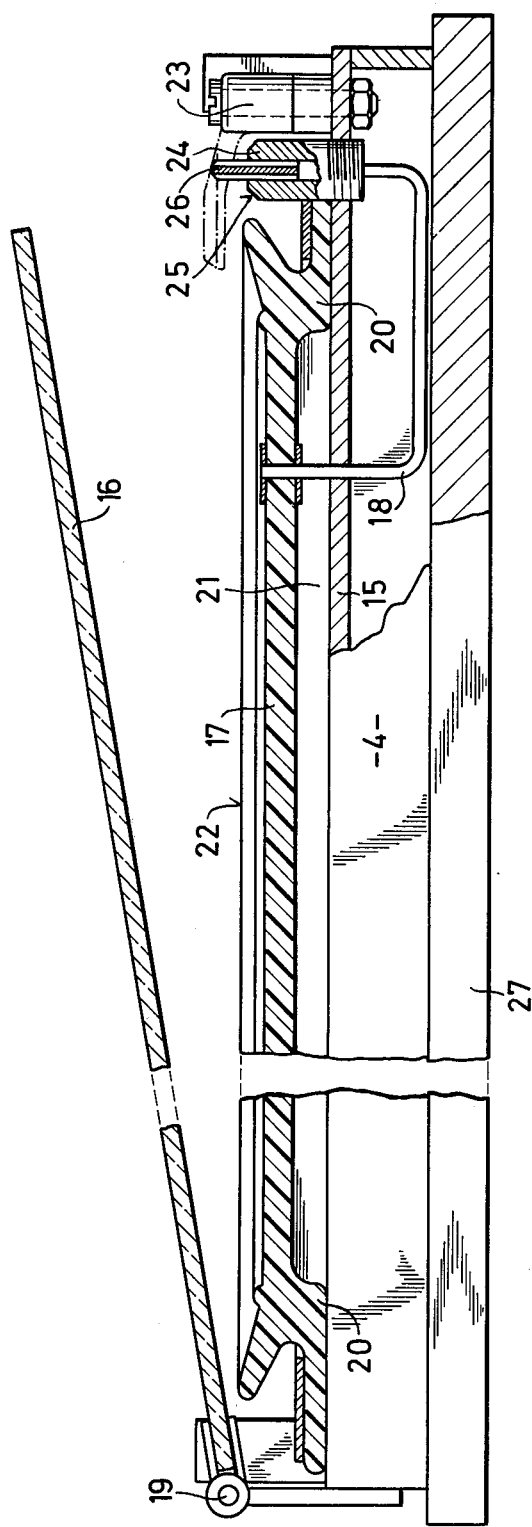
FIG. 3 is a front elevation, partially in section, of a single cassette.

FIG. 3 shows a single copying frame cassette, corresponding to that of FIG. 2, which i used when the apparatus according to FIG. 1 has an exposure section 2 which has one light source only, e.g. the upper light source 12. In this case, the base plate 15 forms a box-shaped body together with a base element 27. The base element 27 also performs the above-mentioned functions of the guide element 10.

Figure 4:
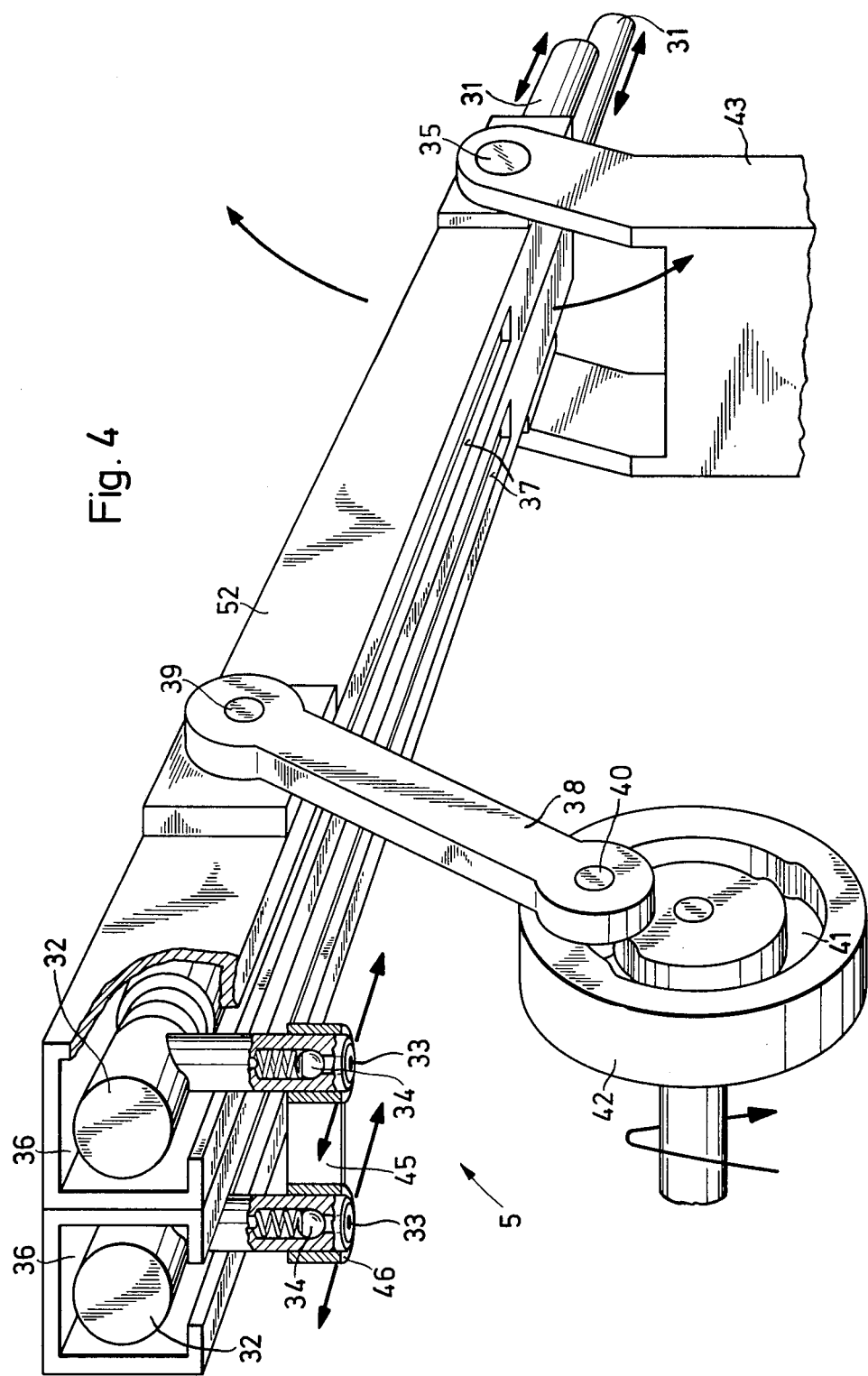
FIG. 4 is an enlarged perspective view of a part of FIG. 1.

The evacuation device, generally indicated at 5 in FIG. 1, is now illustrated with reference to FIGS. 1 and 4. The evacuation device 5 is provided with a vacuum pump 28 to which a vacuum hose drum 30 is connected via a conduit 29. Two hose lines 31 are partially located in the drum 30, to be wound up and off and partially led out of the drum 30 as a portion of device 5 travels with the cassette to the exposure section 2 and returns to its original position. By means of tees 32, connecting counterparts 33 are connected to the led-out hose ends, which counterparts, together with the connecting pieces 24 (FIG. 2) form the above-mentioned quick-connect or connect-disconnect plug coupling. The connecting counterparts 33 are closed by ball valves 34. They are opened by the opening pins 26 (FIG. 2) when the plug couplings 24 – 33 are put together. Putting toegther and releasing of the plug couplings are performed by the lever 52. Lever 52 is arranged by means of a holding piece 43 at the inlet conveyor shaft 6 and pivotable about a pivot bearing 35. In its interior, it has two channels 36 through which the hose lines 31 can be moved to and fro as the coupled hoses move with the cassette and return. So that the connecting counterparts 33 can be moved to and fro with the hoses, the channels 36 are each provided, at the bottom, with longitudinal slits 37. By means of a pivot 39, a rocker lever 38 is pivoted at the free end of the lever 52, to which rocker lever there is mounted a cam lug 40 which runs in the cam groove 41 of a cam disc 42. The driven cam disc 42 effects an up and down movement of the lever 52 in such a manner that, each time a cassette 4 has arrived in the feed section 1 beneath the evacuation device, the lever 52 is lowered and thus presses counterparts 33 onto the connecting pieces 24 and, each time when the cassette 4 has covered a certain distance towards the exposure section 2, the upward movement of the lever 52 starts. This upward movement starts each time a cassette 4 has arrived with its connecting pieces 24 at a holding-down piece 44. From there the latter effects pressing of the connecting counterparts 33 onto the connecting pieces 24 until exposure of the printing plates in the cassette has been completed and transport of the cassette from the exposure section 2 to the discharge part 3 has started. During this time, a glide element 45, mounted to the connecting counterparts 33 by means of sleeves 46, glides beneath the holding-down piece 44 and thereby presses the connecting counterparts 33 onto the connecting pieces 24.

It goes without saying that other embodiments of travelling evacuation devices and other embodiments of releasable evacuation connections can also be used. With the apparatus according to the invention, an evacuation device may be dispensed with in some cases, e.g. in those cases in which the vacuum copying frames are sufficiently air-tight that evacuation performed outside the apparatus remains effective for a sufficiently long time to maintain effective contact between the printing plate and the original.

In the copying apparatus according to FIG. 1, there are provided vertically arranged conveyor shafts 6. According to the invention, the copying apparatus, however, may also be so constructed that transport through the conveyor shafts 6 is performed in a horizontal direction and the copying frame cassettes 4 are vertical during transport from the feed section into the exposure position and, after exposure, during further transport into the discharge section.

When it is advantageous, for space reasons, the construction may further be changed so that the copying frame cassettes are vertically arranged in the conveyor shaft but, when they leave the feed section, are horizontally introduced into the exposure part by pivoting through 90°. The reverse arrangement is also possible, i.e. horizontal arrangement of the copying frame cassettes in the feed section and their rotation through 90° before they are introduced into the exposure part.

Compact construction can be achieved when the exposure part is combined with the feed part. The advantage of such an arrangement resides in the fact that the apparatus requires little space and the transport ways for the copying frame cassettes are shortened. FIG. 5 shows such an apparatus. After introduction into the inlet conveyor shaft 6 (at the right of the drawing), the copying frame cassettes 4 are passed downward into the exposure position 14. After exposure to the light source 12, the copying frame cassette 4 is conveyed horizontally into the outlet conveyor shaft 6 and from there upward through the discharge section 3.

In a similar manner, the copying frame cassettes 4 may be conveyed vertically from the exposure section into the outlet conveyor shaft when the apparatus is constructed as shown in FIG. 6.

In order to still better coordinate the operation of the exposure apparatus, with copying frame cassettes ready for copying, i.e. charged with the copying assembly and evacuated, with the working cycle of the copying department of a graphic firm, it is advantageous to construct the feed and discharge sections so that they are movable. Feed sections provided with rolls may be loaded with copying frame cassettes at various working stations and, according to fixed-cycle times, routed to the exposure sections of one or more apparatuses. In order to operate in this fashion, working tables with vacuum connections are provided. The copying frame cassettes, made ready for copying on the working tables, are loaded in a programmed sequence into the feed sections and passed to the exposure section. From the feed sections, the copying frame cassettes are automatically passed into the exposure position and, after exposure to light, gathered in the discharge section. The filled discharge section is then passed to another working table and the copying frame cassettes are removed.

The advantage of this procedure resides in the fact that the copying frame cassettes can be evacuated at stationary vacuum devices and travelling devices, in the feed and discharge magazines, can thus be dispensed with. This simplifies the mechanical construction of the feed sections.

Another advantage is that, in this manner, an assembly line for exposure of printing plates can be accomplished, which comprises the following working steps:

1. Charging of the copying frame cassette;
2. Evacuation of the copying frame cassette and insertion into the feed section;
3. Transport of the feed section to the exposure section;
4. Exposure to light and insertion into the discharge section;
5. Transport of the discharge section to the working table; and 6. Removal of the copying assembly and further transport of the printing plate to the development station.

The working steps 1 to 6 can be incorporated smoothly between the mounting of the films and further processing of the printing plates in developing devices.

According to another exemplary embodiment, as shown in FIG. 7, the copying frame cassettes 4 are passed via an endless belt 48 to an exposure device 12. It is thus possible to perform exposure with a stationary light source and a stationary copying assembly or to perform exposure with a stationary light source and a moving copying assembly.

For this purpose, the copying frame cassette, as shown in FIG. 3, is provided with a wide strong base element 27. The glass plate 16, the rubber blanket 17, and the hose connection 24 to the evacuation device, however, are constructed in the previously described manner. The width of the frame is so selected that the copying frame cassette can be moved on a ball plate 47. According to FIG. 8, the copying frame cassette 4 is now charged with the copying assembly and evacuated on the ball plate 47. From there, the copying frame cassette is pushed over the ball table onto an endless conveyor belt 48 and conveyed by it to an exposure section 2. When the copying frame cassette has achieved its correct position in the exposure section, the belt 48 is stopped and the assembly is exposed to light, preferably to a point light source. Subsequently, the belt 48 is again put in motion and conveys the copying frame cassette out of the copying apparatus. From the belt, the copying frame cassette can again be pushed onto a ball plate where the copying assembly can be removed. Meanwhile, the next copying frame cassette has been introduced into the copying apparatus.

Completely continuous exposure is achieved when the copying apparatus is provided with an exposure tube having at least the width of the copying frame cassette. In this case, the conveyor belt may continuously feed copying frame cassettes to the exposure section. The copying frame cassettes then run beneath the exposure tube and the printing plate is exposed thereby.

Since the printing plates and the originals can be placed in register into the copying frame cassettes and are firmly pressed together by the evacuation of the copying frame cassette, the conditions for exact image transfer are ensured. When a grid for avoiding scattered light is placed in the exposure device between the exposure tube and the copying frame cassette, even in the case of exposing moving cassettes, the effect of the light source with respect to the transfer of the image elements of the original onto the printing plate is as good as that of a point light source. As in the case of cycle exposure, the running speed depends on the intensity of the light source and the exposure times connected therewith. Preferable, therefore, are high-pressure mercury lamps in the form of tubes with and without doping.

FIG. 7 shows the exposure device of FIG. 8 with the conveyor belt in front elevation and in section. The light source 12 is located in a housing 49 in which a grid for avoiding scattered light is located. It exposes the copying frame cassettes 4 running beneath the grid and charged with the copying assembly. The copying frame cassette is conveyed by the endless conveyor belt 48. In order to prevent displacement of the copying frame cassette during transport, holding bars 51 are mounted at regular distances on the conveyor belt and perpendicularly to the direction of travel of the belt.

It will be obvious to those skilled in the art that many modifications may be made within the scope of the present invention without departing from the spirit thereof, and the invention includes all such modifications.

What is claimed is:

1. A process for exposing a light-sensitive printing plate through an original to be copied, comprising forming a plurality of copying assemblies by bringing, in each assembly, an elastic blanket, said printing plate, said original, and a light-permeable plate into direct contact with one another, in the sequence recited and with the light-sensitive side of said printing plate toward said original, evacuating each assembly to improve the contact between said printing plate and said original, sequentially and continuously conveying the evacuated assemblies through a light-flooded location to pass light through said light-permeable plate and said original to expose said printing plate conveying each assembly from said light-flooded location, and removing the exposed printing plate from each assembly.

2. A process for exposing a light-sensitive printing plate through an original to be copied, comprising forming in a first location at least one copying assembly by bringing an elastic blanket, said printing plate, said original, and a light-permeable plate into direct contact with one another, in the sequence recited and with the light-sensitive side of said printing plate toward said original, evacuating said assembly to improve the contact between said printing plate and said original, again subjecting said assembly to evacuation in a second location, conveying the evacuated assembly into a light-flooded location to pass light through said light-permeable plate and said original to expose said printing plate, conveying said assembly from said light-flooded location, and removing the exposed printing plate from said assembly.

3. A process in accordance with claim 2 wherein the vacuum to which the assembly is subjected the second time is just sufficient to essentially maintain the vacuum created by the first evacuation step.

4. A process in accordance with claim 2 wherein the assembly is subjected to the vacuum the second time at least during the time said assembly resides in the light-flooded location.

5. A process in accordance with claim 2 wherein the assembly is subjected to the vacuum the second time for a period just prior to placing said assembly in the light-flooded location and during the time said assembly resides in said light-flooded location.

6. A process for exposing a light-sensitive printing plate through an original to be copied, comprising forming a plurality of copying assemblies by bringing, in each assembly, an elastic blanket, said printing plate, said original, and a light-permeable plate into direct contact with one another, in the sequence recited and with the light-sensitive side of said printing plate toward said original, evacuating each assembly to improve the contact between said printing plate and said original, sequentially and semi-continuously conveying the evacuated assemblies into a light-flooded location to pass light through said light-permeable plate and said original to expose said printing plate, conveying each assembly from said light-flooded location, and removing the exposed printing plate from each assembly.

7. A process in accordance with claim 6 wherein the assemblies are semi-continuously conveyed through the light-flooded location and exposed in accordance with a fixed time cycle, including a predetermined period of exposure.

8. Apparatus for exposing light-sensitive printing plates through an original to be copied, comprising a light means for exposing said printing plate;

vacuum frame means, including an elastic blanket and a light-permeable plate adapted to be engaged with one another about the periphery thereof and form a cavity therebetween adapted to receive said printing plate and said original superimposed upon one another, with said original adjacent said light-permeable plate and light-sensitive side of said printing plate adjacent said original, to form a unitary assembly, of said vacuum frame, said printing plate and said original, separate from said light means, means permitting the formation of a vacuum in said cavity to improve the contact between said printing plate and said original, and support means which includes a conveyor for moving said unitary assembly into an operative position relative to said light means to expose said printing plate to light from said light means through said light-permeable plate and said original.

9. Apparatus in accordance with claim 8 wherein the unitary assembly comprises two pairs of elastic blankets and light-permeable plates adapted to form two cavities to receive two pairs of printing plates and originals and means permitting the formation of a vacuum in each of said cavities, respectively.

10. Apparatus in accordance with claim 8 wherein the conveyor means is adapted to be operated on a timed cycle, including a predetermined residence time at the operative position relative to the light means.

11. Apparatus in accordance with claim 8 wherein the means permitting formation of vacuum in the cavity includes a connect-disconnect means for temporary connection to a source of vacuum.

12. Apparatus in accordance with claim 11 which additionally includes evacuation means operatively associated with a support having a complimentary connect-disconnect means, coupleable with the connect-disconnect means of the means permitting formation of a vacuum in the cavity, for temporarily coupling said evacuation means to said means permitting formation of a vacuum in the cavity.

13. Apparatus in accordance with claim 12 wherein the evacuation means is associated with the support in a position to be coupled to the means for drawing a vacuum in the cavity during the time the unitary assembly is in an operative position relative to the light means.

14. Apparatus in accordance with claim 12 wherein the support extends beyond the position where the unitary assembly is in operative position relative to the light means and the evacuation means includes means for coupling said evacuation means to the means permitting formation of a vacuum in the cavity, at a point beyond said operative position relative to said light means and said evacuation means is adapted to be moved along said support while coupled to said means permitting formation of a vacuum in said cavity to a point where said unitary assembly is in said operative position relative to said light source.

15. Apparatus in accordance with claim 8 wherein the unitary assembly is a cassette-type assembly.

16. Apparatus in accordance with claim 8 wherein the support is operatively associated with a feed magazine adapted to receive a plurality of unitary assemblies and a discharge magazine adapted to receive a plurality of unitary assemblies.

17. Apparatus in accordance with claim 16 wherein the unitary structures are disposed in a horizontal plane in the feed magazine, are transported in a horizontal plane through the operative position relative to the light means and are disposed in a horizontal plane in the discharge magazine.

18. Apparatus in accordance with claim 17 wherein the unitary structures are transported upwardly through the feed magazine, thence horizontally through the operative position relative to the light means and downwardly through the discharge magazine.

19. Apparatus in accordance with claim 17 wherein the unitary structures are transported downwardly through the feed magazine, thence horizontally through the operative position relative to the light means and then upwardly through the discharge magazine.

20. Apparatus in accordance with claim 16 wherein the light means is mounted at one end of the feed magazine.

21. Apparatus in accordance with claim 20 wherein the feed magazine and discharge magazine are vertically disposed and the unitary structures are transported vertically through said feed magazine to the operative position relative to the light means, thence horizontally to the discharge magazine and then vertically through said discharge magazine.

22. Apparatus in accordance with claim 20 wherein the feed magzine and discharge magazine are horizontally disposed and the unitary structures are transported horizontally through the feed magazine to the operative position relative to the light means, thence vertically to the discharge magazine and then horizontally through said discharge magazine.

* * * * *

UNITED STATES PATENT AND TRADEMARK OFFICE
CERTIFICATE OF CORRECTION

PATENT NO. : 4,033,695
DATED : July 5, 1977
INVENTOR(S) : Georg Sader and Dieter Osswald It is certified that error appears in the above-identified patent and that said Letters Patent are hereby corrected as shown below:

Column 1, line 24, "ligh" should read - - - light - - -.

Column 3, line 60, "th" should read - - - the - - -.

Column 6, line 41, the word "a" has been omitted after "of".

Column 6, line 47, "i" should read - - - is - - -.

Column 11, line 28, the word - - - a - - - has been omitted after "of". Line 41, "for drawing" should read - - - permitting formation of - - -.

Signed and Sealed this

*Twenty-seventh* Day of *September 1977*

[SEAL]

Attest:

RUTH C. MASON
*Attesting Officer*

LUTRELLE F. PARKER
*Acting Commissioner of Patents and Trademarks*